(12) United States Patent
Li et al.

(10) Patent No.: US 11,562,241 B2
(45) Date of Patent: Jan. 24, 2023

(54) DATA OUTPUT METHOD, DATA ACQUISITION METHOD, DEVICE, AND ELECTRONIC APPARATUS

(71) Applicant: Beijing Baidu Netcom Science and Technology Co., Ltd., Beijing (CN)

(72) Inventors: Haoyang Li, Beijing (CN); Yuan Ruan, Beijing (CN)

(73) Assignee: Beijing Baidu Netcom Science and Technology Co., Ltd, Beijing (CN)

(*) Notice: Subject to any disclaimer, the term of this patent is extended or adjusted under 35 U.S.C. 154(b) by 397 days.

(21) Appl. No.: 16/908,633

(22) Filed: Jun. 22, 2020

(65) Prior Publication Data
US 2021/0201134 A1 Jul. 1, 2021

(30) Foreign Application Priority Data
Dec. 31, 2019 (CN) .......................... 201911420585.1

(51) Int. Cl.
*H03M 7/30* (2006.01)
*G06N 3/08* (2006.01)
(Continued)

(52) U.S. Cl.
CPC ................ *G06N 3/08* (2013.01); *G06N 3/04* (2013.01); *H03M 7/30* (2013.01); *H03M 7/3064* (2013.01);
(Continued)

(58) Field of Classification Search
CPC ........ H03M 7/30; H03M 7/6005; G06N 3/08; G06N 3/04; G06F 16/24568; G06F 3/064; G06F 13/28
See application file for complete search history.

(56) References Cited

U.S. PATENT DOCUMENTS 5,058,187 A 10/1991 Kim
5,363,098 A 11/1994 Antoshenkov
(Continued)

FOREIGN PATENT DOCUMENTS

CN 102891732 A 1/2013
CN 103023509 A 4/2013
(Continued)

OTHER PUBLICATIONS

Japanese Office Action, issued from Japan Patent Office, to JP Application No. 2020-107989 dated Jun. 17, 2021, 8 pages.
(Continued)

*Primary Examiner* — Joseph J Lauture
(74) *Attorney, Agent, or Firm* — Hunton Andrews Kurth LLP

(57) ABSTRACT

A data output method, a data acquisition method, a device, and an electronic apparatus are provided, and a specific technical solution is: reading a first data sub-block, and splicing the first data sub-block into a continuous data stream, wherein the first data sub-block is a data sub-block in transferred data in a neural network; compressing the continuous data stream to acquire a second data sub-block; determining, according to a length of the first data sub-block and a length of the second data sub-block, whether there is a gain in compression of the continuous data stream; outputting the second data sub-block if there is the gain in the compression of the continuous data stream.

17 Claims, 10 Drawing Sheets

(51) Int. Cl.
*G06N 3/04* (2006.01)
*G06F 16/2455* (2019.01)
*G06F 13/28* (2006.01)

(52) U.S. Cl.
CPC .......... *H03M 7/6005* (2013.01); *G06F 13/28* (2013.01); *G06F 16/24568* (2019.01)

(56) References Cited

U.S. PATENT DOCUMENTS

| | | | |
|---|---|---|---|
| 6,831,575 | B2 | 12/2004 | Wu et al. |
| 2007/0109156 | A1 | 5/2007 | Fallon |
| 2017/0070238 | A1 | 3/2017 | Liang |
| 2017/0228252 | A1 | 8/2017 | Gadelrab et al. |
| 2018/0067679 | A1 | 3/2018 | Adrianus Heddes et al. |
| 2018/0248562 | A1 | 8/2018 | Redfern et al. |
| 2018/0299943 | A1 | 10/2018 | McBride et al. |
| 2021/0200437 | A1* | 7/2021 | Li .................... G06F 3/0656 |

FOREIGN PATENT DOCUMENTS

| | | |
|---|---|---|
| CN | 103138766 A | 6/2013 |
| CN | 105207678 A | 12/2015 |
| CN | 105488534 A | 4/2016 |
| CN | 105653484 A | 6/2016 |
| CN | 106506007 A | 3/2017 |
| CN | 103281156 B | 6/2017 |
| CN | 108604211 A | 9/2018 |
| CN | 108615076 A | 10/2018 |
| CN | 109582653 A | 4/2019 |
| CN | 110049333 A | 7/2019 |
| CN | 110352412 A | 10/2019 |
| CN | 110520909 A | 11/2019 |
| JP | 2010287114 A | 12/2010 |
| JP | 2018063505 A | 4/2018 |
| JP | 2019530076 A | 10/2019 |
| KR | 930003416 B1 | 4/1993 |

OTHER PUBLICATIONS

Extended European Search Report, issued from European Patent Office, to EP Application No. 20180844.1, dated Nov. 17, 2020, 8 pages.

Second Office Action issued from the Chinese Patent Office to Chinese Application No. 201911420585.1 dated Apr. 13, 2021, 25 pages.

First Office Action issued from the State Intellectual Property Office of People's Republic of China to Application No. 201911420585.1, dated Jan. 15, 2021, 21 pages.

Network Intrusion and forensics, Jan. 6, 2021, 4 pages.

\* cited by examiner

DATA OUTPUT METHOD, DATA ACQUISITION METHOD, DEVICE, AND ELECTRONIC APPARATUS

CROSS-REFERENCE TO RELATED APPLICATION

This application claims a priority to Chinese Patent Application No. 201911420585.1 filed in China on Dec. 31, 2019, the disclosures of which are incorporated in their entirety by reference herein.

TECHNICAL FIELD

The present application relates to a technical field of a neural network in computer technology, and in particular, relates to a data output method, a data acquisition method, a device, and an electronic apparatus.

BACKGROUND

At present, neural networks are widely used, for example: Convolutional Deep Neutral Networks (CDNNs) are widely used in Internet applications, such as speech recognition, image recognition, natural language processing and other applications. However, neural network calculations are generally completed in Neural Processing Units (NPUs). After the neural network calculations are performed, results of the calculations need to be transferred to an off-chip storage. Due to a limited bandwidth of the off-chip storage, in many practical service scenarios, time of transferring data between an on-chip and an off-chip exceed actual calculation time, resulting in poor performance of the neural networks.

SUMMARY

The present application provides a data output method, a data acquisition method, a data output device, a data acquisition device and an electronic apparatus, so as to solve the problem of poor performance of a neural network.

In a first aspect, a data output method is provided in the present application, and the method includes: reading a first data sub-block, and splicing the first data sub-block into a continuous data stream, wherein the first data sub-block is a data sub-block in transferred data in a neural network; compressing the continuous data stream to acquire a second data sub-block; determining, according to a length of the first data sub-block and a length of the second data sub-block, whether there is a gain in compression of the continuous data stream; outputting the second data sub-block if there is the gain in the compression of the continuous data stream.

Since the data sub-block of the transferred data in the neural network is compressed, and data acquired after compression is outputted if a gain exists in compression, so that an efficiency of data transfer may be improved, and thus performance of the neural network may be improved.

Optionally, determining, according to the length of the first data sub-block and the length of the second data sub-block, whether there is the gain in the compression of the continuous data stream includes: calculating, according to the length of the first data sub-block, a destination address and a bus bit-width of a storage, the number of beats required for transferring the first data sub-block; calculating, according to the length of the second data sub-block, the destination address and the bus bit-width of the storage, the number of beats required for transferring the second data sub-block; determining, if the number of beats required for transferring the second data sub-block is less than the number of beats required for transferring the first data sub-block, that there is the gain in the compression of the continuous data stream, otherwise, determining that there is no gain in the compression of the continuous data stream, wherein the destination address is a destination address of the first data sub-block.

In the implementation manner, whether there is the compression gain may be accurately determined by the number of beats required for transferring.

Optionally, the method further includes: storing a length field, wherein the length field is used to indicate a smaller value between the length of the first data sub-block and the length of the second data sub-block, and the length field is used for reading a data sub-block corresponding to the length field when reading data.

In the implementation manner, since the length field is stored, the data sub-block may be accurately read when reading data.

Optionally, the method further includes: storing a flag bit of the second data sub-block if the second data sub-block is outputted, wherein the stored flag bit is used to indicate whether there is a compression gain in a case that the second data sub-block is compressed.

Since the flag bit is stored, it is possible to accurately determine whether decompression is required in a case that the second data sub-block is read, so as to avoid erroneous decompression and further improve data processing performance.

Optionally, the transferred data in the neural network includes a plurality of data sub-blocks of a first type, wherein each of the plurality of data sub-blocks of the first type has a same size. Compressing the continuous data stream to acquire the second data sub-block includes: determining whether the first data sub-block is a data sub-block of the first type, and compressing the continuous data stream to acquire the second data sub-block if the first data sub-block is the data sub-block of the first type.

In the implementation manner, it may be implemented that only the data sub-block of the first type is compressed, which may increase a probability that there is the compression gain for the compressed data sub-block, to improve performance of data compression.

Optionally, the transferred data in the neural network further includes a data sub-block of a second type and/or a data sub-block of a third type, wherein the data sub-block of the second type and/or the data sub-block of the third type are data sub-blocks formed by remaining data after the transferred data in the neural network is segmented into the plurality of data sub-blocks of the first type.

In the implementation manner, it may be implemented that the data sub-block of the second type and the data sub-block of the third type are not compressed, which may increase a probability that there is the compression gain for the compressed data sub-block, to improve performance of data compression.

Optionally, the method further includes: outputting the first data sub-block if there is no gain in the compression of the continuous data stream.

In the implementation manner, in a case that there is no gain in the compression of the continuous data stream, the first data sub-block is outputted, which may avoid a problem that an efficiency of data transfer is reduced due to outputting the second data sub-block in a case that there is no gain.

In a second aspect, a data acquisition method is provided in the present application, and the method includes: reading a length of a second data sub-block; reading the second data sub-block; determining whether the second data sub-block is a data sub-block acquired after compression and having a compression gain; decompressing the second data sub-block if the second data sub-block is the data sub-block acquired after compression and having the compression gain, and storing data acquired after decompression.

Optionally, determining whether the second data sub-block is the data sub-block acquired after compression and having the compression gain includes: determining, according to the length of the second data sub-block, whether the second data sub-block is the data sub-block acquired after compression and having the compression gain; or reading a flag bit of the second data sub-block, and determining, according to the flag bit, whether the second data sub-block is the data sub-block acquired after compression and having the compression gain, wherein the flag bit is used to indicate whether there is the compression gain in a case that the second data sub-block is compressed.

Optionally, determining, according to the length of the second data sub-block, whether the second data sub-block is the data sub-block acquired after compression and having the compression gain includes: calculating, according to an original length of data corresponding to the second data sub-block, a storage address and a bus bit-width of a storage, the number of beats required for transferring original data corresponding to the second data sub-block; calculating, according to the length of the second data sub-block, the storage address and the bus bit-width of the storage, the number of beats required for transferring the second data sub-block; determining, if the number of beats required for transferring the second data sub-block is less than the number of beats required for transferring the original data corresponding to the second data sub-block, that the second data sub-block is the data sub-block acquired after compression and having the compression gain, otherwise, determining that the second data sub-block is not the data sub-block acquired after compression and having the compression gain, wherein the storage address is a storage address of the second data sub-block.

Optionally, the second data sub-block is a data sub-block in transferred data in a neural network, the transferred data in the neural network includes a plurality of data sub-blocks of a first type, wherein each of the plurality of data sub-blocks of the first type has a same size. Determining whether the second data sub-block is the data sub-block acquired after compression and having the compression gain includes: determining whether the second data sub-block is the data sub-block of the first type, and determining whether the second data sub-block is the data sub-block acquired after compression and having the compression gain if the second data sub-block is the data sub-block of the first type.

Optionally, the transferred data in the neural network further includes a data sub-block of a second type and/or a data sub-block of a third type, wherein the data sub-block of the second type and/or the data sub-block of the third type are data sub-blocks formed by remaining data after the transferred data in the neural network is segmented into the plurality of data sub-blocks of the first type.

Optionally, the method further includes: storing the second data sub-block if the second data sub-block is not the data sub-block acquired after compression and having the compression gain.

In a third aspect, a data output device is provided in the present application, and the device includes: a reading module, configured to read a first data sub-block, and splice the first data sub-block into a continuous data stream, wherein the first data sub-block is a data sub-block in transferred data in a neural network; a compression module, configured to compress the continuous data stream to acquire a second data sub-block; a determination module, configured to determine, according to a length of the first data sub-block and a length of the second data sub-block, whether there is a gain in compression of the continuous data stream; a first output module, configured to output the second data sub-block if there is the gain in the compression of the continuous data stream.

In a fourth aspect, a data acquisition device is provided in the present application, and the device includes: a first reading module, configured to read a length of a second data sub-block; a second reading module, configured to read the second data sub-block; a determination module, configured to determine, according to a length or a flag bit of the second data sub-block, whether the second data sub-block is a data sub-block acquired after compression and having a compression gain; a decompression module, configured to decompress the second data sub-block if the second data sub-block is the data sub-block acquired after compression and having the compression gain, and store data acquired after decompression.

In a fifth aspect, an electronic apparatus is provided in the present application, and the electronic apparatus includes: at least one processor; and a storage connected to the at least one processor; wherein, the storage stores an instruction executable by the at least one processor, the instruction is performed by the at least one processor to enable the at least one processor to perform the data output method according to the present application, or to enable the at least one processor to perform the data acquisition method according to the present application.

In a sixth aspect, the present application provides a non-transitory computer-readable storage medium storing a computer instruction, wherein the computer instruction is used to cause a computer to perform the data output method provided in the present application, or the computer instruction is used to cause the computer to perform the data acquisition method provided in the present application.

An embodiment in the application has the following advantages or beneficial effects.

A first data sub-block is read, and the first data sub-block is spliced into a continuous data stream, wherein the first data sub-block is a data sub-block in transferred data in a neural network; the continuous data stream is compressed to acquire a second data sub-block; according to a length of the first data sub-block and a length of the second data sub-block, it is determined whether there is a gain in the compression of the continuous data stream; the second data sub-block is outputted if there is a gain in the compression of the continuous data stream. Therefore, the technical problem of poor performance of the neural network is overcome, and the technical effect of improving the performance of the neural network is achieved.

Other effects possessed by the optional implementation manners will be described below in combination with specific embodiments.

BRIEF DESCRIPTION OF THE DRAWINGS

The accompanying drawings are used to facilitate understanding of technical solutions in the present application, and do not constitute a limitation on the present application.

DETAILED DESCRIPTION

Exemplary embodiments of the present application are described below with reference to the accompanying drawings, which include various details of the embodiments of the present application to facilitate understanding, and which should be considered to be merely exemplary. Therefore, those of ordinary skill in the art should recognize that various changes and modifications may be made to the embodiments described herein without departing from a scope and a spirit of the present application. Also, for clarity and conciseness, descriptions of well-known functions and structures are omitted in the following description.

Figure 1:
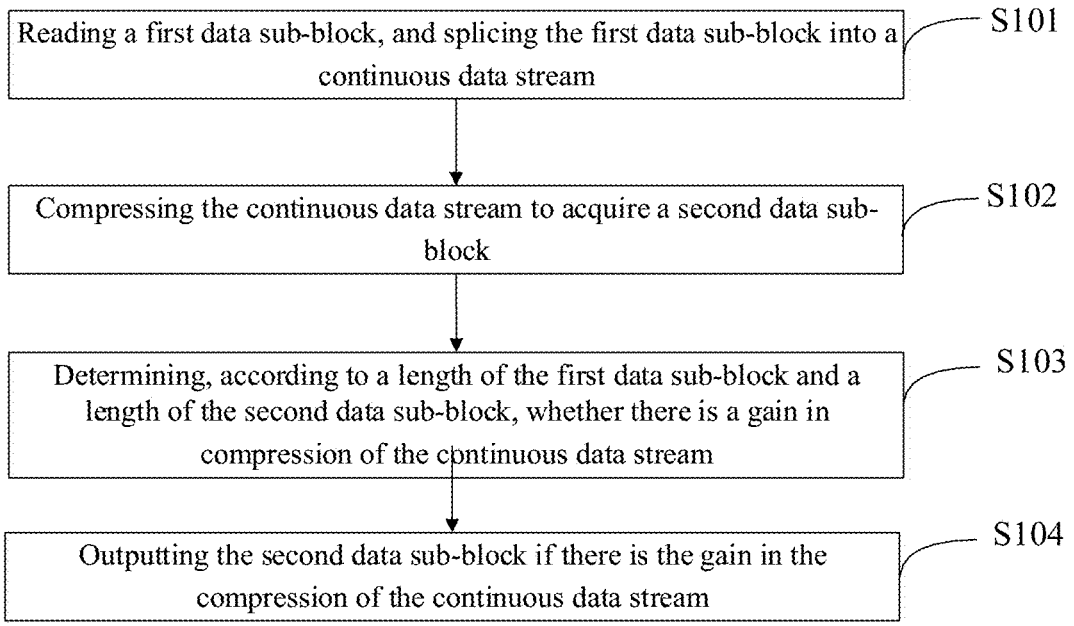
FIG. 1 is a flowchart of a data output method provided in the present application.

Referring to FIG. 1, FIG. 1 is a flowchart of a data output method provided in the present application. As shown in FIG. 1, the method includes following steps S101-S104.

Step S101: reading a first data sub-block, and splicing the first data sub-block into a continuous data stream, wherein the first data sub-block is a data sub-block in transferred data in a neutral network.

The transferred data in the neutral network may be data acquired after performing calculations on the neutral network, such as a weight matrix, a feature map or other data. The data sub-block may be a data sub-block among a plurality of data sub-blocks acquired by segmenting the transferred data.

Address information of the first data sub-block may be discontinuous address information, that is, the first data sub-block includes data with discontinuous addresses. The reading the first data sub-block and splicing the first data sub-block into the continuous data stream may be shifting and splicing the read first data sub-block to acquire a continuous and complete data stream of the first data sub-block. For example, according to the address information of the first data sub-block, data of the first data sub-block are read in a discontinuous manner and the read data are spliced into the continuous and complete data stream. The continuous and complete data stream here means that various data are continuous, and the continuous and complete data stream includes all data of the first data sub-block.

Since the first data sub-block is spliced into the continuous data stream, this may support compression of discontinuous data, increase a size of a data sub-block subjected to the compression, and thus improve an efficiency of a compression processing.

Step S102: compressing the continuous data stream to acquire a second data sub-block.

A compression algorithm used to compress the continuous data stream in Step S102 includes but is not limited to: compression algorithms such as zero-value compression, run-length coding, Huffman coding, and Golomb coding. A specific compression algorithm is not limited in the present application.

The second data sub-block may be understood as compressed data acquired by compressing the continuous data stream.

Step S103: determining, according to a length of the first data sub-block and a length of the second data sub-block, whether there is a gain in the compression of the continuous data stream.

The determining, according to the length of the first data sub-block and the length of the second data sub-block, whether there is a gain in the compression of the continuous data stream may be determining whether the length of the second data sub-block is smaller than the length of the first data sub-block, and if smaller, determining that there is a gain in the compression of the continuous data stream, otherwise, determining that there is no gain in the compression; or, the determining, according to the length of the first data sub-block and the length of the second data sub-block, whether there is a gain in the compression of the continuous data stream may be: according to the length of the first data sub-block, a destination address and a bus bit-width of a storage, calculating the number of beats required for transferring the first data sub-block, and according to the length of the second data sub-block, the destination address and the bus bit-width of the storage, calculating the number of beats required for transferring the second data sub-block, and if the number of beats required for transferring the second data sub-block is less than the number of beats required for transferring the first data sub-block, determined that there is a gain in the compression of the continuous data stream, otherwise, otherwise, determining that there is no gain in the compression of the continuous data stream, wherein the destination address is a destination address of the first data sub-block.

It should be noted that, since the second data sub-block is acquired by compressing the first data sub-block, destination addresses of the first and second data sub-blocks may be related to each other.

The according to the length of the first data sub-block, the destination address and the bus bit-width of the storage, calculating the number of beats required for transferring the first data sub-block may be: determining firstly, according to the destination address and the bus bit-width of the storage, a size of data transferred in a first row of the first data sub-block; for example, if a starting address of the first row is aligned with the bus bit-width of the storage, then the size of data transferred in the first row is equal to the bus bit-width of the storage, that is, a size of data transferred in a first beat is equal to the bus bit-width of the storage; if the starting address of the first row is not aligned with the bus bit-width of the storage, a size of data transferred in the first row is equal to a size of data from the starting address of the first row to a boundary of the bus bit-width of the storage, that is, the size of data transferred in the first beat is equal to the size of data from the starting address of the first row to the boundary of the bus bit-width of the storage; in a case that there are other rows and after the size of data transferred in the first row is determined, a size of remaining data in the first data sub-block may be divided by the bus bit-width of the storage to acquire a quotient, the acquired quotient is rounded up, and remaining beats may be acquired. The number of beats required for transferring the second data sub-block is determined similarly, and will not be repeated here.

For example, for 1024 B data with address being aligned (the starting address is aligned with the bus bit-width of the storage), if the bus bit-width is 64 B, then it takes 16 beats to complete transfer of the data on a bus. If a length of data acquired after compression becomes 960 B, then only 15 beats are required to complete transfer of the data acquired after the compression. Such a case is defined as that there is a gain in compression of the basic block. If the length of the data acquired after the compression becomes 961 B, 16 beats are still required to complete transfer of the data acquired after the compression. There is no difference of beats between transfer of the data acquired after the compression and direct transfer of original data. Such a case is defined as that there is no gain in compression of the basic block.

Step S104: outputting the second data sub-block if there is the gain in the compression of the continuous data stream.

The outputting the second data sub-block may be performing a write operation on the second data sub-block, for example, writing the second data sub-block into the storage, specifically into an off-chip storage.

It should be noted that the data output method provided in the present application may be applied to a chip (or called a processor) used for calculation of a neural network, such as a Neural Processing Unit (NPU) or a hardware accelerator.

In the present application, a data sub-block of data transferred for a neutral network may be compressed through the above steps, and the data acquired after compression is outputted if there is a gain in the compression, so that efficiency of data transfer may be improved, and thus performance of the neural network may be improved.

Figure 2:
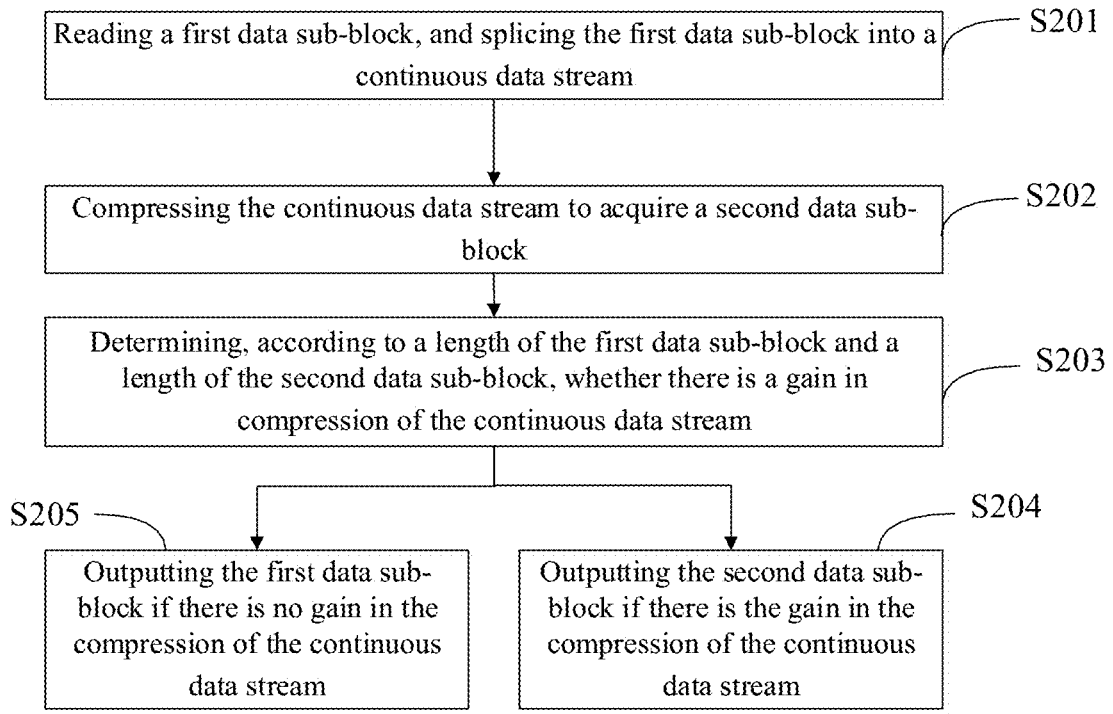
FIG. 2 is another flowchart of a data output method provided in the present application.

Referring to FIG. 2, FIG. 2 is another flowchart of a data output method provided in the present application. As shown in FIG. 2, the method includes following steps S201-S204.

Step S201: reading a first data sub-block, and splicing the first data sub-block into a continuous data stream, wherein the first data sub-block is a data sub-block in transferred data in a neutral network.

Figure 3:
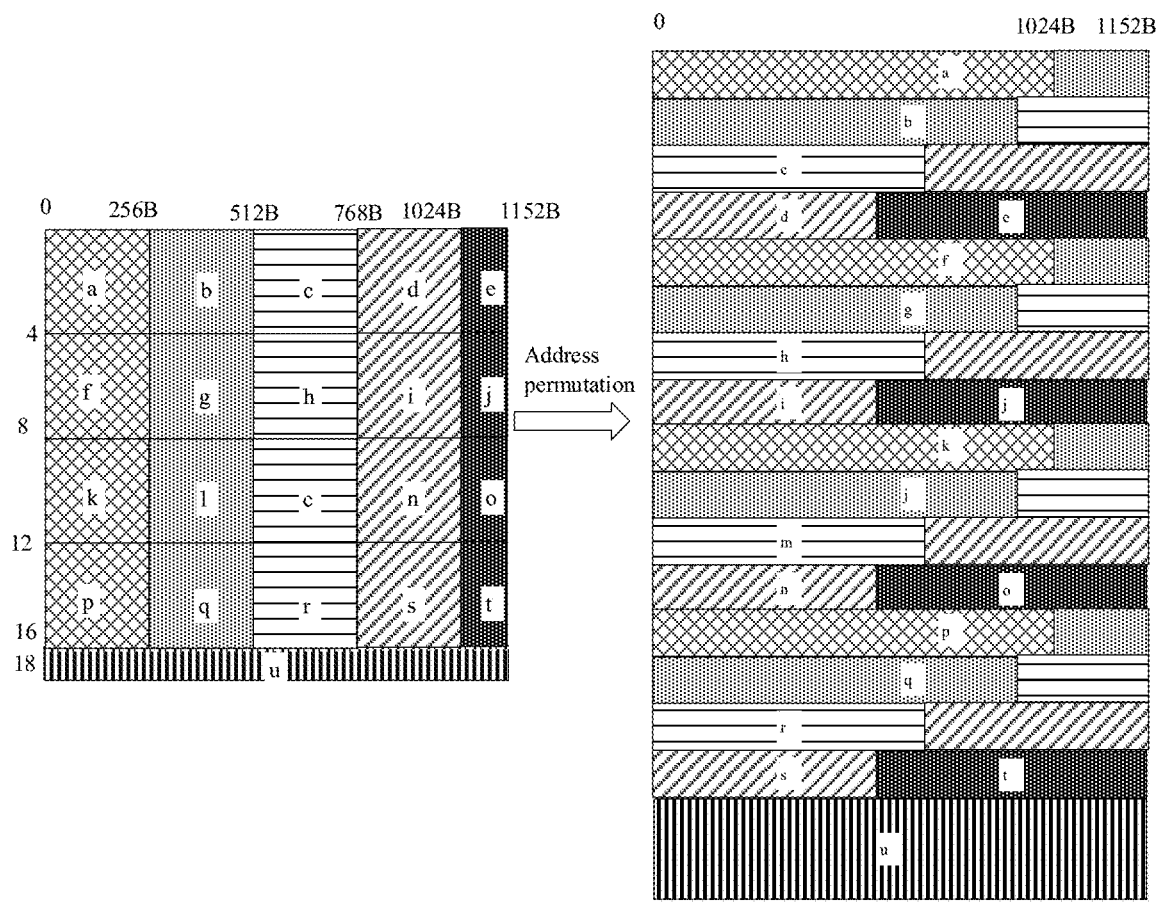
FIG. 3 is a schematic diagram of segmentation of a data sub-block provided in the present application.
Figure 4:
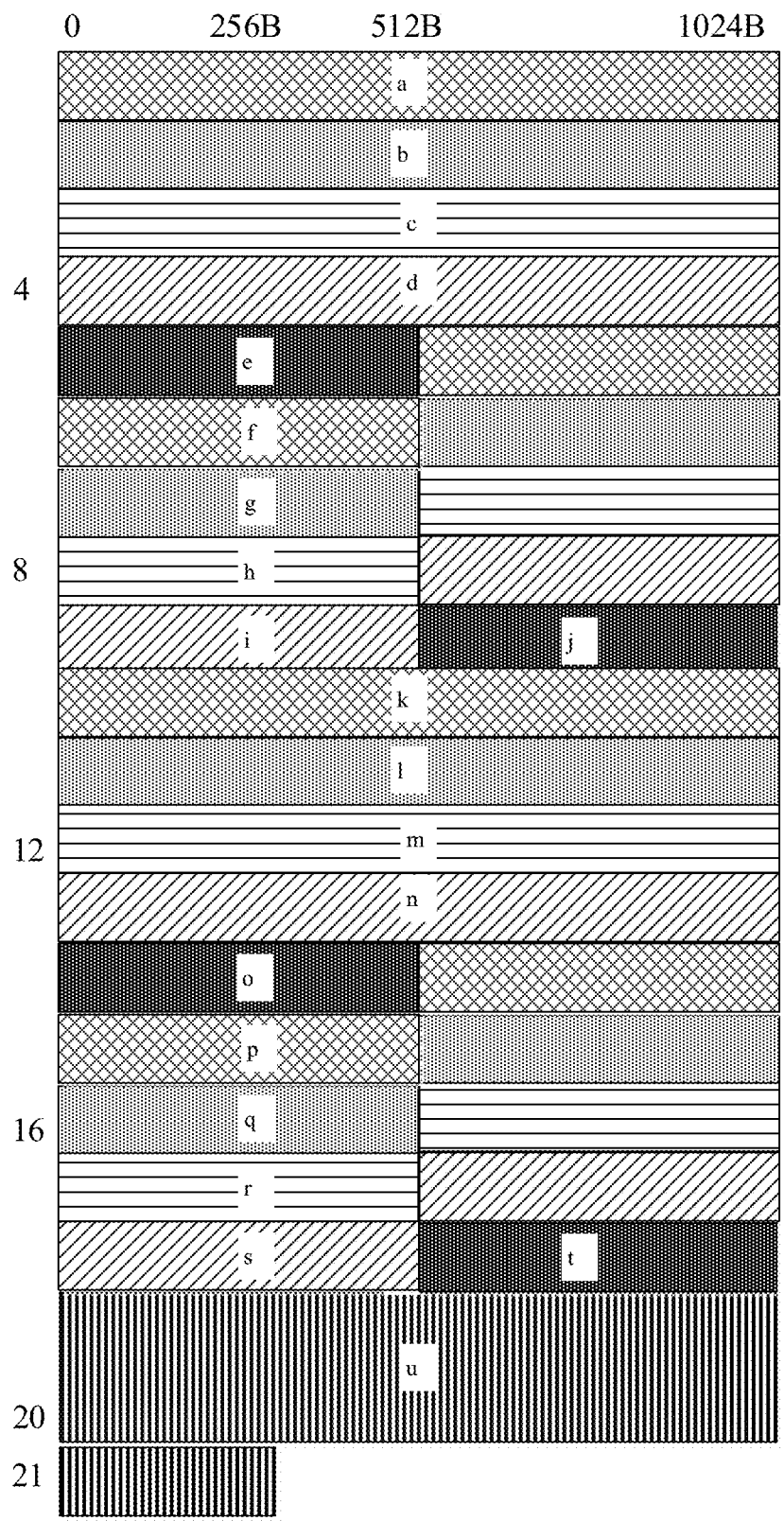
FIG. 4 is a schematic diagram of a data flow of a data sub-block provided in the present application.

The reading the first data sub-block, and splicing the first data sub-block into the continuous data stream may be performing permutation on addresses of a plurality of first data sub-block to acquire the continuous data stream spliced by the plurality of first data sub-blocks. For example, as shown in FIG. 3, the transferred data in the neutral network includes data sub-blocks "a" to "u", wherein addresses of the data sub-blocks are discontinuous. Through Step S201, permutation is performed on the addresses of the data sub-blocks to acquire a continuous data stream of the data sub-blocks shown on the right side of FIG. 3. Further, the continuous data stream may be represented as a data flow shown in FIG. 4 from a perspective of a storage.

Step S202: compressing the continuous data stream to acquire a second data sub-block.

Figure 5:
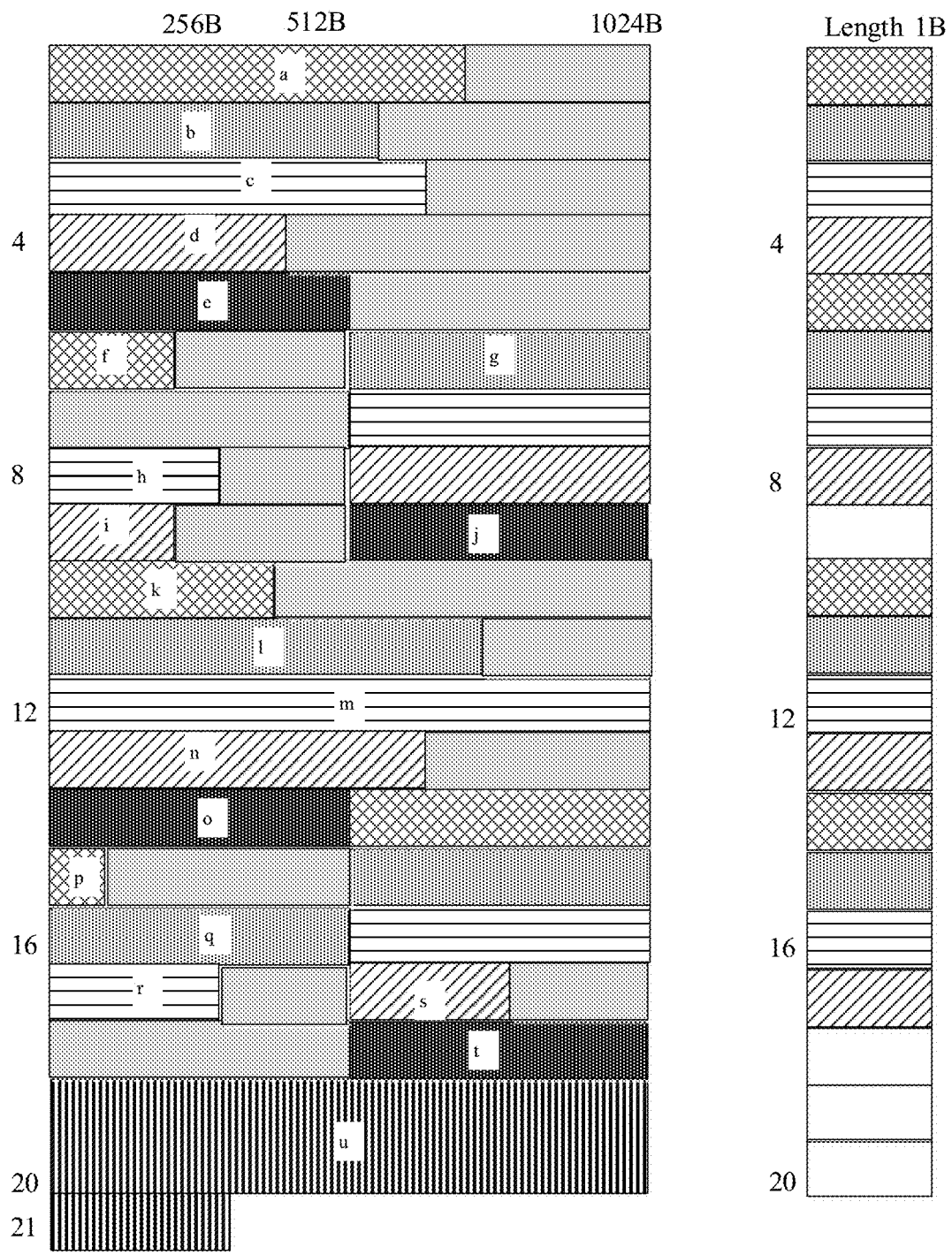
FIG. 5 is a schematic diagram of compression of a data sub-block provided in the present application.

Effects of compressing different continuous data streams in the present application may be different. For example, as shown in FIG. 5, the data stream of the data sub-blocks in FIG. 3 may be compressed into a data stream shown on the left side of FIG. 5, wherein a part in FIG. 5 filled with a gray color represents invalid storage addresses (also called invalid data part) after compression. Further, as shown on the right side of FIG. 5, a 1 B-length storage address used to store a length of data acquired after compression may also be configured for each of the data sub-blocks. Specifically, the 1 B-length storage address may be configured for each data sub-block (a basic block) of a first type.

Optionally, the transferred data in a neural network includes a plurality of data sub-blocks of a first type, wherein the plurality of data sub-blocks of the first type have the same size. The compressing the continuous data stream to acquire the second data sub-block includes: determining whether the first data sub-block is a data sub-block of the first type, and compressing the continuous data stream to acquire the second data sub-block if the first data sub-block is the data sub-block of the first type.

The determining whether the first data sub-block is the data sub-block of the first type may be determining based on configuration information of the data sub-block, wherein the configuration information may include type information of each data sub-block, of course, may also be determined based on information of permutation of the addresses, which is not limited in the present application.

Optionally, the transferred data in the neural network further includes a data sub-block of a second type and/or a data sub-block of a third type, wherein the data sub-block of the second type and/or the data sub-block of the third type are data sub-blocks formed by remaining data after the transferred data in the neural network is segmented into a plurality of data sub-blocks of the first type.

Figure 6:
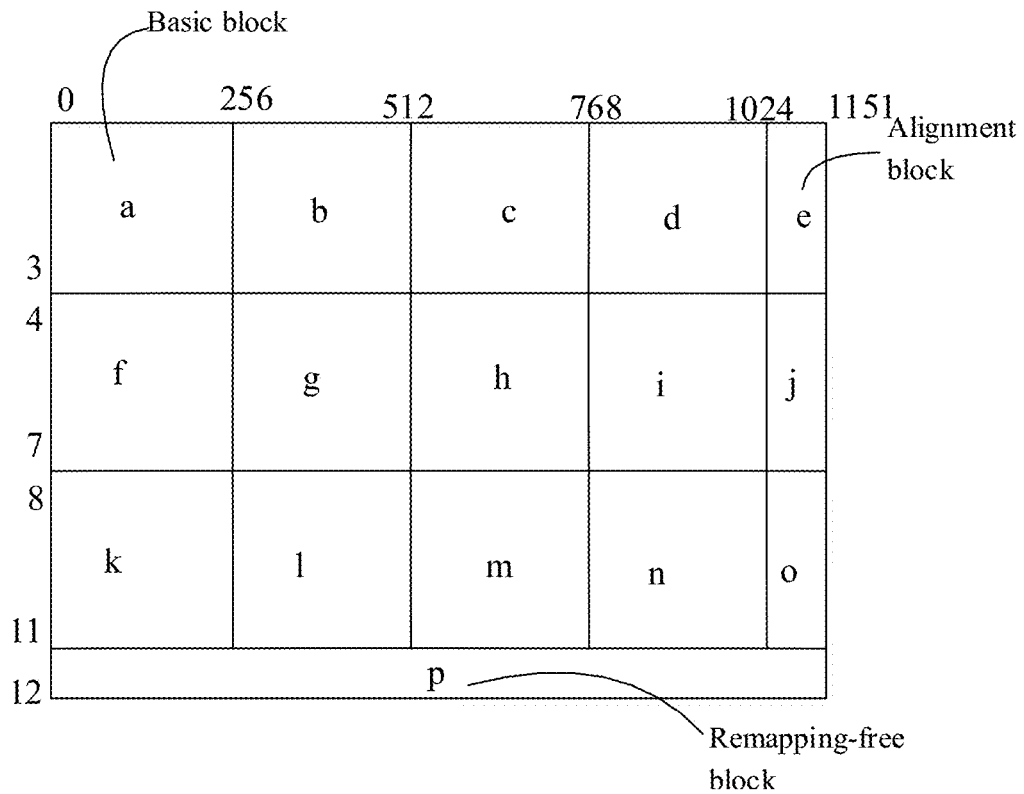
FIG. 6 is another schematic diagram of segmentation of a data sub-block provided in the present application.

The data sub-block of the first type may be called a basic block, the data sub-block of the second type may be called an alignment block, and the data sub-block of the third type may be called a remapping-free block. In addition, data sub-blocks of the second type may be data sub-blocks into which remaining data columns are segmented according to the number of rows of the data sub-blocks of the first type in a case where the number of columns of the transferred data in the neural network is not dividable by the number of columns of data blocks of the first type. Data sub-blocks of the third type may be data sub-blocks formed by remaining data rows in a case where the number of columns of the transferred data in the neural network is not dividable by the number of rows of the data blocks of the first type. For example, as shown in FIG. 6, data in a 13*1151 matrix shown in FIG. 6 may be segmented into data sub-blocks such as basic blocks, alignment blocks, and remapping-free blocks. ((0, 0), (11, 1023)) includes 12 basic blocks which are a, b, c, d, f, g, h, i, k, 1, m and n; ((0, 1024), (11, 1151)) includes 3 alignment blocks which are e, j and o, ((12, 0), (12, 1151)) p is a remapping-free block.

In the embodiment, since the transferred data in the neural network is segmented so that a plurality of data sub-blocks of the first type are included, it may avoid a problem that the transferred data in the neural network may not be cached on an on-chip cache due to a small capacity of the on-chip cache. Since the data sub-blocks of the first type are data sub-blocks after segmentation is performed, the data sub-blocks of the first type may be cached on the on-chip cache so as to perform a compression processing, thereby improving a performance of processing neural network data. In addition, the data sub-block of the second type and the data sub-block of the third type are not compressed, therefore, unnecessary compression with a limited actual gain of compression due to the small size of the data sub-blocks of the second type and the data sub-blocks of the third type can be avoided. On the other hand, it may also be ensured that a fine-grained random access is achieved for the data sub-blocks of the second type and the data sub-blocks of the third type.

Step S203: determining, according to a length of the first data sub-block and a length of the second data sub-block, whether there is a gain in compression of the continuous data stream.

Step S204: outputting the second data sub-block if there is the gain in the compression of the continuous data stream.

Optionally, a length field is stored, wherein the length field is used to indicate a smaller value between the length of the first data sub-block and the length of the second data sub-block, and the length field is used for reading a data sub-block corresponding to the length field when reading the data.

For example, if the second data sub-block is outputted, the length field indicates the length of the second data sub-block. As another example, if the first data sub-block is outputted, the length field indicates the length of the first data sub-block.

Through the above length field, the data sub-block may be accurately read in a case that the data sub-block is read. In addition, the above storing may be storing in an on-chip storage, or may be storing in an off-chip storage. Further, a storage position of the above length field may be a storage position configured before Step S205 is performed. Specifically, it may be that each of the data sub-blocks corresponds to its own length storage position, preferably, it may be that each of the data sub-blocks of the first type corresponds to its own length storage position.

Optionally, if the second data sub-block is outputted, a flag bit of the second data sub-block is stored, and the stored flag bit is used to indicate whether there is a compression gain in a case that the second data sub-block is compressed.

Since the flag bit is stored, it is possible to accurately determine whether decompression is required in a case that the second data sub-block is read, so as to avoid erroneous decompression and further improve data processing performance.

Step S205: outputting the first data sub-block if there is no gain in the compression of the continuous data stream.

Optionally, if the first data sub-block is outputted, a flag bit of the first data sub-block is stored, and the stored flag bit is used to indicate whether there is a gain in compression of the first data sub-block.

In a case that there is no gain in the compression of the continuous data stream, the first data sub-block is directly written into a storage, such as an external storage.

In the embodiment, in a case that there is no gain in the compression of the continuous data stream, the first data sub-block is outputted, which may avoid a problem that an efficiency of data transfer is reduced due to outputting the second data sub-block in a case that there is no gain.

In the embodiment, a variety of optional implementations are added on the basis of the embodiment shown in FIG. 1, and all of the implementations may improve the performance of the neural network.

Figure 7:
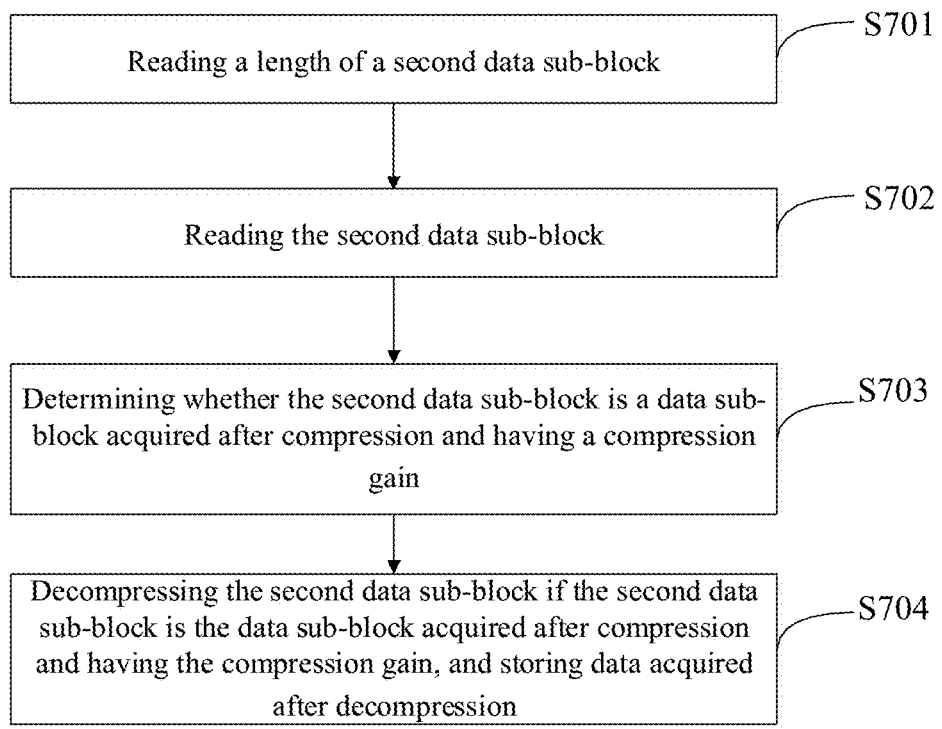
FIG. 7 is a flowchart of a data acquisition method provided in the present application.

Referring to FIG. 7, FIG. 7 is a flowchart of a data acquisition method provided in the present application. As shown in FIG. 7, the method includes the following steps S701-S704.

Step S701: reading a length of a second data sub-block.
Step S702: reading the second data sub-block.

Step S702 may be reading the second data sub-block from a storage, further, may be reading the second data sub-block from an off-chip storage.

Step S703: determining whether the second data sub-block is a data sub-block acquired after compression and having a compression gain.

The second data sub-block may be the second data sub-block in the embodiments shown in FIG. 1 and FIG. 2.

If the second data sub-block is data acquired after compression, an original length of data corresponding to the second data sub-block may be a length of the first data sub-block before the compression of the second data sub-block. If the second data sub-block is not data acquired after compression, an original length of data corresponding to the second data sub-block may be the length of the second data sub-block, or may be null. Further, the original length of data corresponding to the second data sub-block may be equivalent to the length of the first data sub-block in the embodiments shown in FIG. 1 and FIG. 2.

Description of the compression gain may be acquired by referring to corresponding description of the embodiments shown in FIG. 1 and FIG. 2, and details thereof are not described here.

Optionally, determining whether the second data sub-block is a data sub-block acquired after compression and having a compression gain includes: determining whether the second data sub-block is the data sub-block acquired after compression and having the compression gain according to the length of the second data sub-block; or reading a flag bit of the second data sub-block, and determining whether the second data sub-block is the data sub-block acquired after compression and having the compression gain according to the flag bit, wherein the flag bit is used to indicate whether there is the compression gain in a case that the second data sub-block is compressed.

Further, the determining whether the second data sub-block is a data sub-block acquired after compression and having a compression gain according to the length of the second data sub-block includes: calculating, according to an original length corresponding to the second data sub-block, a storage address and a bus bit-width of a storage, the number of beats required for transferring original data corresponding to the second data sub-block, and calculating, according to the length of the second data sub-block, the storage address and the bus bit-width of the storage, the number of beats required for transferring the second data sub-block, and determining, if the number of beats required for transferring the second data sub-block is less than the number of beats required for transferring the original data corresponding to the second data sub-block, that the second data sub-block is the data sub-block acquired after compression and having the compression gain, otherwise, determining that the second data sub-block is not the data sub-block acquired after compression and having the compression gain, wherein the storage address is a storage address of the second data sub-block.

Description of the implementation may be acquired by referring to corresponding description of the embodiment shown in FIG. 1, and details thereof are not described here.

Step S704: decompressing the second data sub-block if the second data sub-block is the data sub-block acquired after compression and having the compression gain, and storing data acquired after decompression.

The storing data acquired after decompression may be storing, in an on-chip cache, the data acquired after decompression, specifically may be storing in a preset position or an expected position of the on-chip cache.

It should be noted that the data acquisition method provided in the present application may be applied to a chip (or called a processor) used for neural network calculation, such as a Neural Processing Unit (NPU) or a hardware accelerator.

In the present application, it may be implemented through the steps that the read data may be data acquired after compression and having a compression gain, so that the efficiency of data transfer is improved, and thus performance of the neural network is improved.

Optionally, the second data sub-block is a data sub-block in transferred data in the neural network, the transferred data in the neural network includes a plurality of data sub-blocks of the first type, wherein each of the data sub-blocks of the first type has the same size.

The determining whether the second data sub-block is a data sub-block acquired after compression and having the compression gain includes: determining whether the second data sub-block is a data sub-block of the first type, and determining whether the second data sub-block is the data sub-block acquired after compression and having the compression gain if the second data sub-block is the data sub-block of the first type.

Optionally, the transferred data in the neural network further includes a data sub-block of the second type and/or a data sub-block of the third type, wherein the data sub-block of the second type and/or the data sub-block of the third type are data sub-blocks formed by remaining data after the transferred data in the neural network is segmented into a plurality of the data sub-blocks of the first type.

Description of the implementation may be acquired by referring to the corresponding description of the embodiment shown in FIG. 2, details thereof are not described here, and the same beneficial effects may be achieved.

Optionally, the method further includes: storing the second data sub-block if the second data sub-block is not the data sub-block acquired after compression and having the compression gain.

The storing the second data sub-block may be storing the second data sub-block directly in a preset position or an expected position of an on-chip cache.

In the implementation, if the second data sub-block is not the data sub-block acquired after compression and having the compression gain, the second data sub-block is stored, which may avoid a decompression error caused by decompressing the second data sub-block in such a case.

In the present application, it may be implemented through the steps that the read data may be data acquired after compression and having a compression gain, so that an efficiency of data transfer is improved, and thus performance of the neural network is improved.

Figure 8:
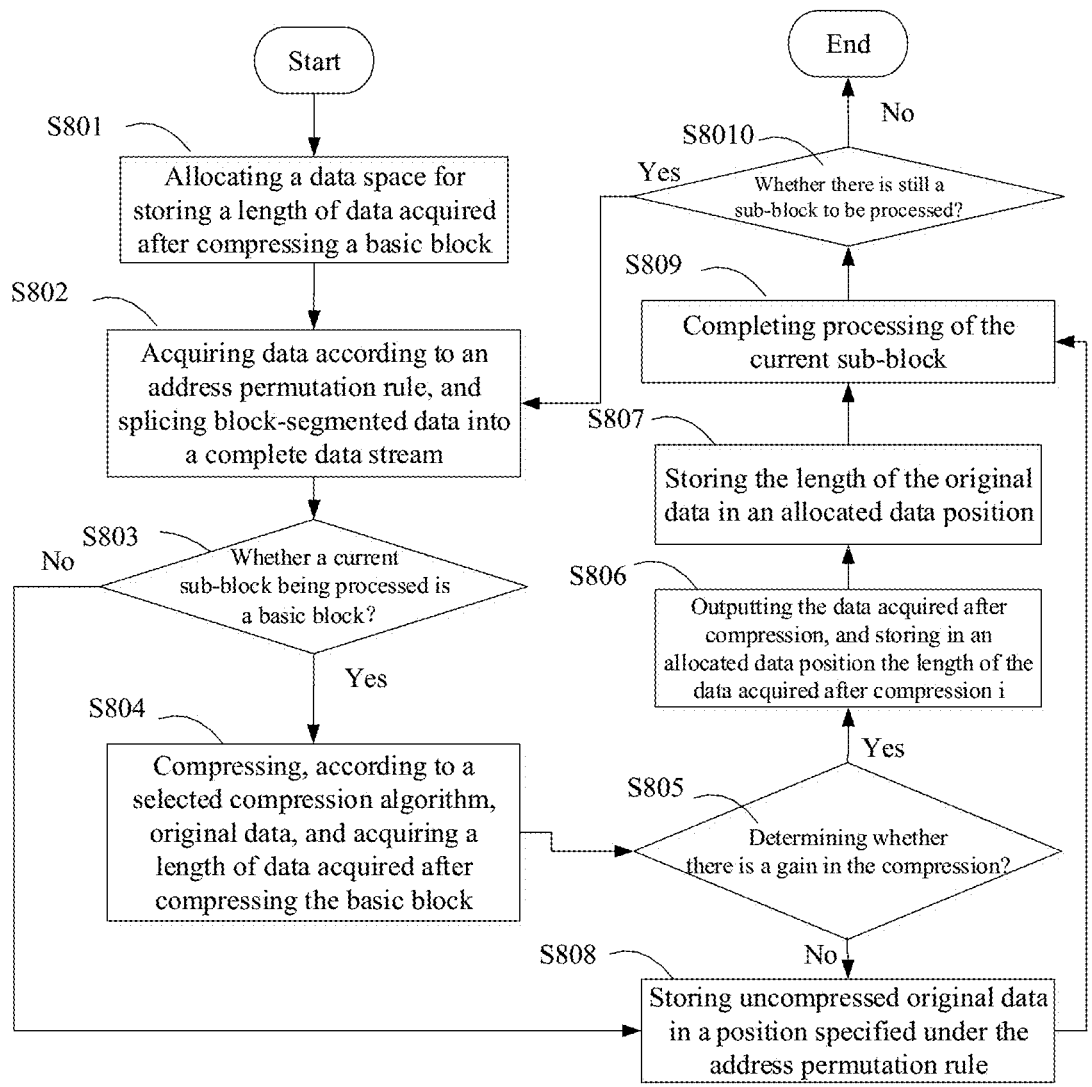
FIG. 8 is another flowchart of a data output method provided in the present application.

Referring to FIG. 8, FIG. 8 is another flowchart of a data output method provided in the present application. As shown in FIG. 8, the method includes the following steps S801-S8010.

Step S801: allocating a data space for storing a length of data acquired after compressing a basic block;

Step S802: acquiring data according to an address permutation rule, and splicing block-segmented data into a complete data stream;

Step S803: determining a block type to which a current sub-block being processed belongs, and performing Step S804 if the sub-block is a basic block, otherwise turning to Step S808;

Step S804: compressing, according to a selected compression algorithm, original data, and acquiring a length of data acquired after compressing the basic block;

Step S805: determining, according to a length of the original data and the length of the data acquired after compression, whether there is a gain in the compression, and performing Step S806 if there is the gain in the compression; performing Step S808 if there is no gain in the compression;

Step S806: outputting the data acquired after compression, storing the data in a position specified under the address permutation rule, and calculating the length of the data acquired after compression and storing the length in a data position allocated in Step S801;

Step S807: storing the length of the original data in a data position allocated in Step S801;

Step S808: storing uncompressed original data in a position specified under the address permutation rule;

Step S809: completing processing of the current sub-block;

Step S8010: determining whether there is still a sub-block to be processed. Step S802 is performed if there is still the sub-block to be processed. The process ends if there are no subsequent sub-block to be processed.

Figure 9:
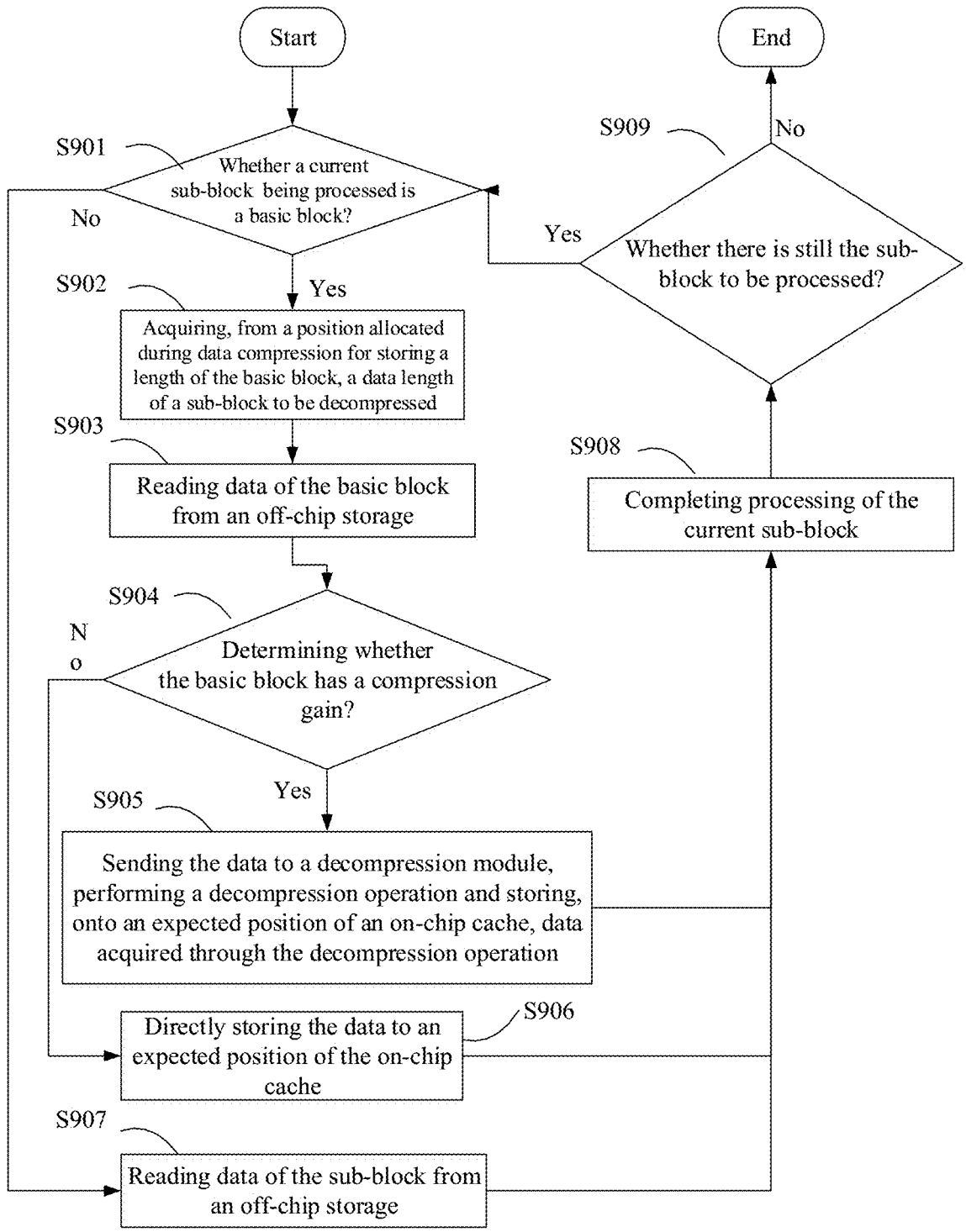
FIG. 9 is another flowchart of a data acquisition method provided in the present application.

Referring to FIG. 9, FIG. 9 is another flowchart of a data acquisition method provided in the present application. As shown in FIG. 9, the method includes the following steps S901-S909.

Step S901: determining a block type to which a current sub-block being processed belongs, and performing Step S902 if the sub-block is a basic block; performing Step S907 if the sub-block is not a basic block; wherein the step may be determining, according to an address permutation rule, the block type to which the current sub-block being processed belongs, or determining, according to configuration information of the data sub-block, the block type to which the sub-block belongs.

Step S902: acquiring, from a position allocated during data compression for storing a length of the basic block, a data length of a sub-block to be decompressed.

Step S903: reading data of the basic block from an off-chip storage; wherein, a length of the read data is acquired in Step S902.

Step S904: comparing a length of original data of the basic block with the length of the data acquired in Step S902, and determining whether the basic block has a compression gain; if there is the gain, the basic block was subjected to compression, and Step S905 is performed; if there is no gain, the basic block was not subjected to compression, and Step S906 is performed.

Step S905: sending the data to a decompression module, performing a decompression operation and storing, onto an expected position of an on-chip cache, data acquired through the decompression operation; then performing Step S908.

Step S906: directly storing the data to an expected position of the on-chip cache; then performing Step S908.

Step S907: reading data of the sub-block from an off-chip storage, and storing the data to an expected position of the on-chip cache; then performing Step S908.

Step S908: completing processing of the current sub-block;

Step S909: determining whether there is still a sub-block to be processed; performing Step S901 if there is still the sub-block to be processed; ending if there is no subsequent sub-block to be processed.

Figure 10:
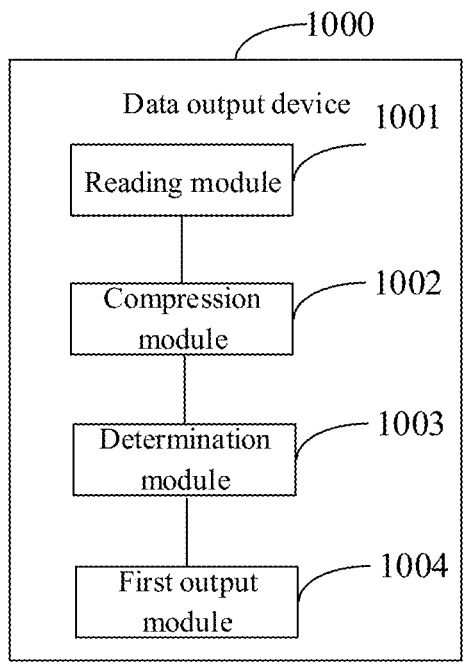
FIG. 10 is a structural diagram of a data output device provided in the present application.

Referring to FIG. 10, FIG. 10 is a structural diagram of a data output device provided in the present application. As shown in FIG. 10, the data output device 1000 includes: a reading module 1001, configured to read a first data sub-block, and splice the first data sub-block into a continuous data stream, wherein the first data sub-block is a data sub-block in transferred data in a neutral network; a compression module 1002, configured to compress the continuous data stream to acquire a second data sub-block; a determination module 1003, configured to determine, according to a length of the first data sub-block and a length of the second data sub-block, whether there is a gain in compression of the continuous data stream; a first output module 1004, configured to output the second data sub-block if there is the gain in the compression of the continuous data stream.

Optionally, the determination module 1003 is configured to calculate, according to the length of the first data sub-block, a destination address and a bus bit-width of a storage, the number of beats required for transferring the first data sub-block, calculate, according to the length of the second data sub-block, the destination address and the bus bit-width of the storage, the number of beats required for transferring the second data sub-block, determine, if the number of beats required for transferring the second data sub-block is less than the number of beats required for transferring the first data sub-block, that there is the gain in the compression of the continuous data stream, otherwise, determine that there is no gain in the compression of the continuous data stream, wherein the destination address is a destination address of the first data sub-block.

Figure 11:
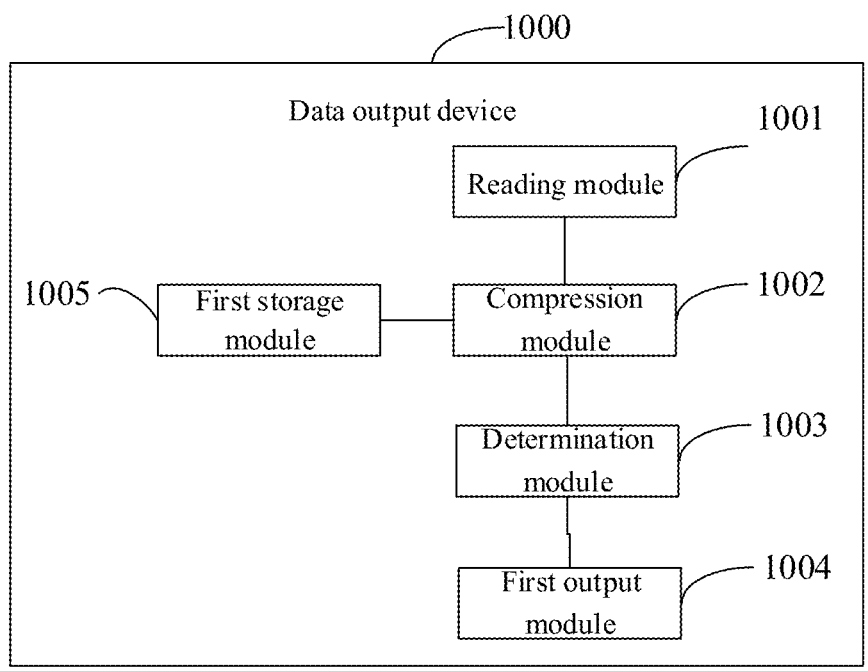
FIG. 11 is another structural diagram of a data output device provided in the present application.

Optionally, as shown in FIG. 11, the device further includes: a first storage module 1005, configured to store a length field, wherein the length field is used to indicate a smaller value between the length of the first data sub-block and the length of the second data sub-block, and the length field is used for reading a data sub-block corresponding to the length field when reading data.

Figure 12:
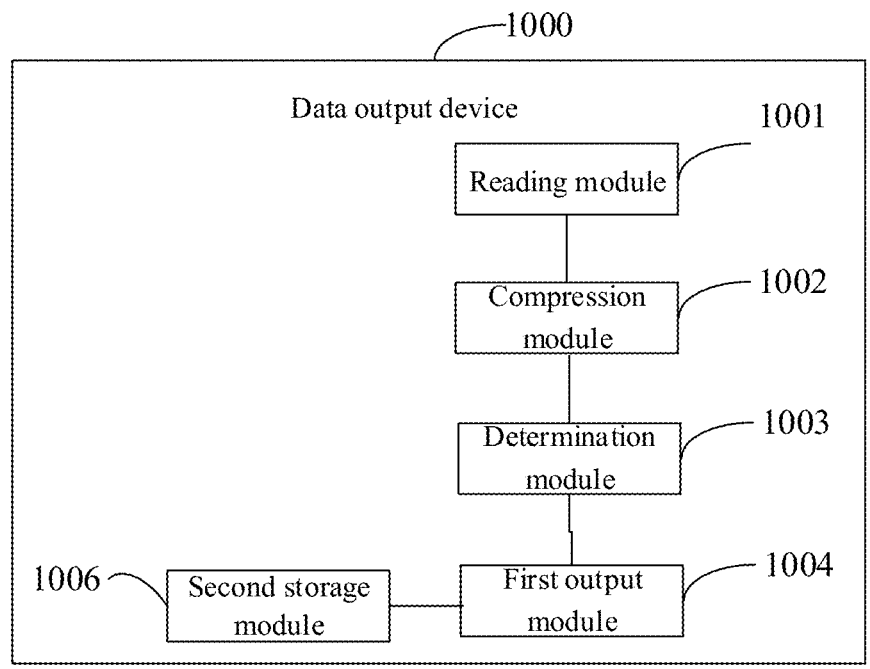
FIG. 12 is still another structural diagram of a data output device provided in the present application.

Optionally, as shown in FIG. 12, the device further includes: a second storage module 1006, configured to store a flag bit of the second data sub-block if the second data sub-block is outputted, wherein the stored flag bit is used to indicate whether there is a compression gain in a case that the second data sub-block is compressed.

Optionally, the transferred data in the neural network includes a plurality of data sub-blocks of a first type, wherein each of the data sub-blocks of the first type has the same size. The compression module 1002 is configured to determine whether the first data sub-block is the data sub-block of the first type, and compress the continuous data stream to acquire the second data sub-block if the first data sub-block is the data sub-block of the first type.

Optionally, the transferred data in the neural network further includes a data sub-block of the second type and/or a data sub-block of the third type, wherein the data sub-block of the second type and/or the data sub-block of the third type is a data sub-block formed by remaining data after the transferred data in the neural network is segmented into a plurality of the data sub-blocks of the first type.

Figure 13:
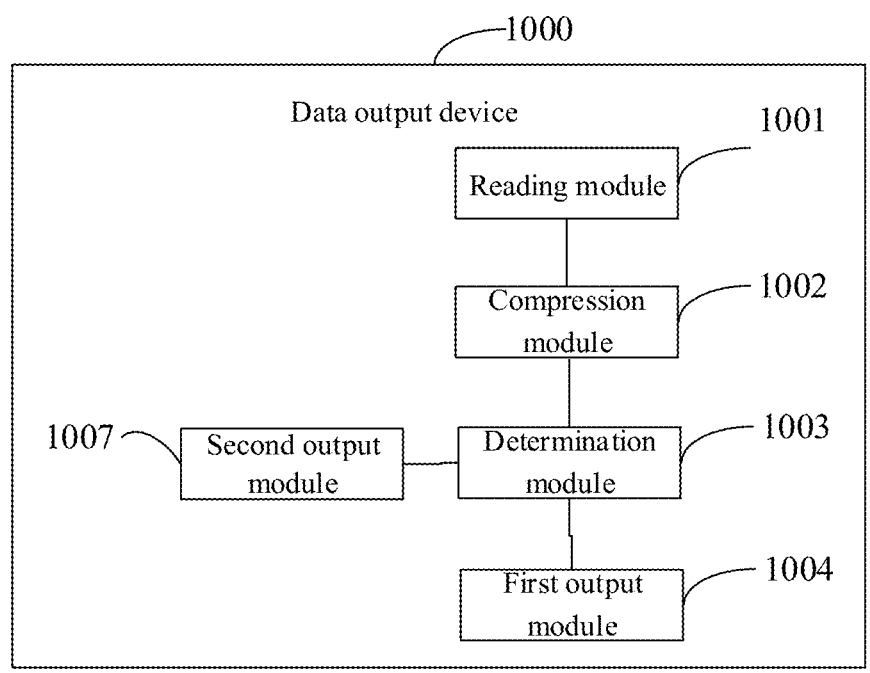
FIG. 13 is yet another structural diagram of a data output device provided in the present application.

Optionally, as shown in FIG. 13, the device further includes: a second output module 1107, configured to output the first data sub-block if there is no gain in the compression of the continuous data stream.

The device provided in the embodiment may implement various processes implemented in the method embodiments shown in FIG. 1 and FIG. 3, and achieve the same beneficial effects. To avoid repetition, details thereof are not described herein again.

Figure 14:
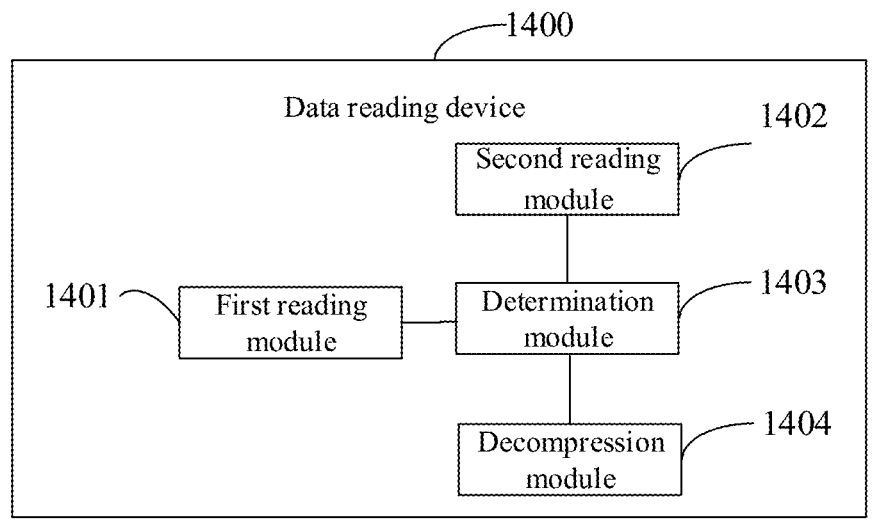
FIG. 14 is a structural diagram of a data acquisition device provided in the present application.

Referring to FIG. 14, FIG. 14 is a structural diagram of a data acquisition device provided in the present application. As shown in FIG. 14, the data acquisition device 1400 includes: a first reading module 1401, configured to read a length of a second data sub-block; a second reading module 1402, configured to read the second data sub-block; a determination module 1403, configured to determine whether the second data sub-block is a data sub-block acquired after compression and having a compression gain; a decompression module 1404, configured to decompress the second data sub-block if the second data sub-block is the data sub-block acquired after compression and having the compression gain, and store data acquired after decompression.

Optionally, the determination module 1403 is configured to determine, according to the length of the second data sub-block, whether the second data sub-block is the data sub-block acquired after compression and having the compression gain; or the determination module 1403 is configured to read a flag bit of the second data sub-block, and determine, according to the flag bit, whether the second data sub-block is the data sub-block acquired after compression and having the compression gain, wherein the flag bit is used to indicate whether there is the compression gain in a case that the second data sub-block is compressed.

Optionally, the determination module 1403 is configured to calculate, according to an original length of data corresponding to the second data sub-block, a storage address and a bus bit-width of a storage, the number of beats required for transferring original data corresponding to the second data sub-block, calculate, according to the length of the second data sub-block, the storage address and the bus bit-width of the storage, the number of beats required for transferring the second data sub-block, determine, if the number of beats required for transferring the second data sub-block is less than the number of beats required for transferring the original data corresponding to the second data sub-block, that the second data sub-block is the data sub-block acquired after compression and having the compression gain, otherwise, determine that the second data sub-block is not the data sub-block acquired after compression and having the compression gain, wherein the storage address is a storage address of the second data sub-block.

Optionally, the second data sub-block is a data sub-block in transferred data in the neural network, wherein each of the data sub-blocks of the first type has the same size.

The determination module 1403 is configured to determine whether the second data sub-block is the data sub-block of the first type, and determine whether the second data sub-block is the data sub-block acquired after compression and having the compression gain according to the length of the second data sub-block or the flag bit if the second data sub-block is the data sub-block of the first type.

Optionally, the transferred data in the neural network further includes a data sub-block of the second type and/or a data sub-block of the third type, wherein the data sub-block of the second type and/or the data sub-block of the third type are data sub-blocks formed by remaining data after the transferred data in the neural network is segmented into a plurality of the data sub-blocks of the first type.

Figure 15:
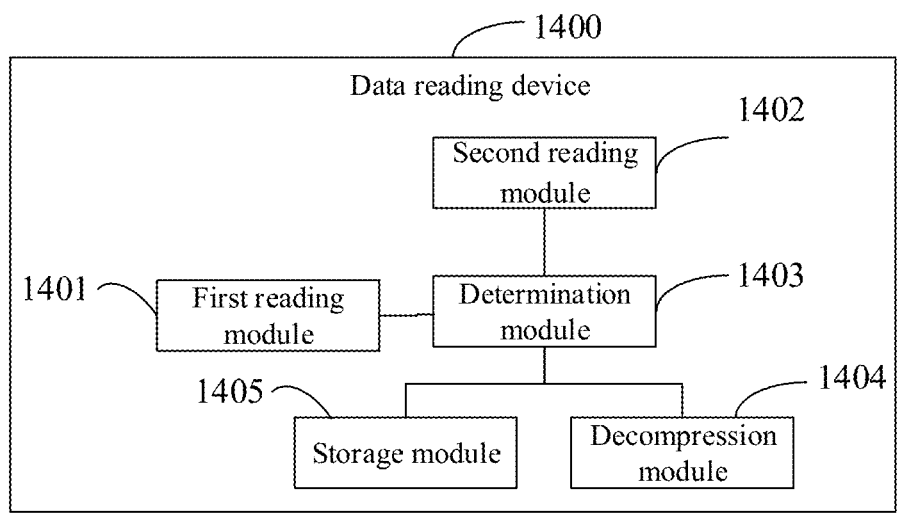
FIG. 15 is another structural diagram of a data acquisition device provided in the present application.

Optionally, as shown in FIG. 15, the device further includes: a storage module 1405, configured to store the second data sub-block if the second data sub-block is not the data sub-block acquired after compression and having the compression gain.

The device provided in the embodiment may implement various processes implemented in the method embodiment shown in FIG. 7 and achieve the same beneficial effects. To avoid repetition, details thereof are not described here.

According to an embodiment of the present application, the present application also provides an electronic apparatus and a readable storage medium.

Figure 16:
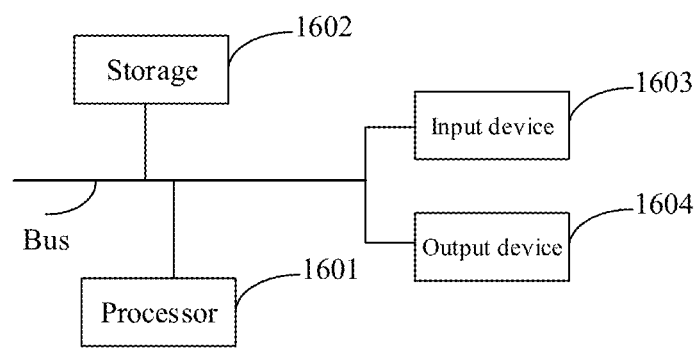
FIG. 16 is a block diagram of an electronic apparatus according to the present application.

As shown in FIG. 16, FIG. 16 is a block diagram of an electronic apparatus for performing a data output method or a data acquisition method according to the present application. The electronic apparatus is intended to represent various forms of digital computers, such as laptop computers, desktop computers, workbenches, personal digital assistants, servers, blade servers, mainframe computers, and other suitable computers. The electronic apparatus may also represent various forms of mobile devices, such as personal digital processing devices, cellular phones, smart phones, wearable devices, and other similar computing devices. The components shown here, connections and relationships thereof, and functions thereof are merely examples, and are not intended to limit the implementation of the present application described and/or claimed herein.

As shown in FIG. 16, the electronic apparatus includes: one or more processors 1601, a storage 1602, and interfaces for connecting various components, including high-speed interfaces and low-speed interfaces. The various components are connected to each other using different buses and may be installed on a common motherboard or in other ways as needed. The processor may process instructions performed within the electronic apparatus, the instructions include instructions stored in or on the storage to display graphical information of a GUI on an external input/output device such as a display device coupled to the interface. In other embodiments, a plurality of processors and/or a plurality of buses may be used with a plurality of storages if desired. Similarly, a plurality of electronic apparatuses may be connected, and each apparatus (e.g., as a server array, a group of blade servers, or a multi-processor system) provides some necessary operations. In FIG. 16, a single processor 1601 is taken as an example.

The storage 1602 is a non-transitory computer-readable storage medium provided in the present application. The storage stores instructions that may be performed by at least one processor, so that the at least one processor performs the data output method or the data acquisition method provided in the present application. The non-transitory computer-readable storage medium of the present application stores computer instructions for causing a computer to perform the data output method or the data acquisition method provided in the present application.

The storage 1602 as a non-transitory computer-readable storage medium may be used to store non-transitory software programs, non-transitory computer executable programs and modules, such as program instructions/modules corresponding to the data output method or the data acquisition method in the embodiments of the present application (e.g., the reading module 1001, the compression module 1002, the determination module 1003, and first output module 1004 shown in FIG. 10, or the first reading module 1401, the second reading module 1402, the determination module 1403 and the decompression module 1404 shown in FIG. 14). The processor 1601 runs the non-transitory software programs, instructions, and modules stored in the storage 1602 to perform various functional applications and data processing of a server, that is, to implement the data output method or the data acquisition method in the above method embodiments.

The storage 1602 may include a storage program region and a storage data region, wherein the storage program region may store an operating system and an application program required by at least one function; the storage data region may store data or the like created based on use of the electronic apparatus for the data output method or the data acquisition method. In addition, the storage 1602 may include a high-speed random access storage, and may further include a non-transitory storage, such as at least one magnetic disk storage device, a flash memory device, or other non-transitory solid-state storage device. In some embodiments, the storage 1602 may optionally include memories set remotely with respect to the processor 1601, and these remote memories may be connected to the electronic apparatus for the data output method or the data acquisition method through a network. Examples of the above network include but are not limited to the Internet, an intranet, a local area network, a mobile communication network, and combinations thereof.

The electronic apparatus for the data output method or the data acquisition method may further include: an input device 1603 and an output device 1604. The processor 1601, the storage 1602, the input device 1603, and the output device 1604 may be connected by a bus or other ways. A connection through the bus is taken as an example in FIG. 16.

The input device 1603 may receive input digital or character information, and generate key signal inputs related to user settings and function control of the electronic apparatus for the data output method or the data acquisition method, such as a touch screen, a keypad, a mouse, a trackpad, a touchpad, a pointing stick, one or more mouse buttons, a trackball, a joystick and other input devices. The output device 1604 may include a display device, an auxiliary lighting device (e.g., an LED), a tactile feedback device (e.g., a vibration motor), and the like. The display device may include, but is not limited to, a liquid crystal display (LCD), a light emitting diode (LED) display, and a plasma display. In some embodiments, the display device may be a touch screen.

Various embodiments of the systems and techniques described herein may be implemented in a digital electronic circuitry, an integrated circuit system, a dedicated application specific integrated circuit (ASIC), computer hardware, firmware, software, and/or a combination thereof. These various embodiments may be implemented in one or more computer programs, the one or more computer programs may be executed and/or interpreted on a programmable system including at least one programmable processor, the programmable processor may be a dedicated or general-purpose programmable processor, which may receive data and instructions from the storage system, at least one input device, and at least one output device, and transmit the data and the instructions to the storage system, the at least one input device, and the at least one output device.

These computing programs (also called programs, software, software applications, or codes) include machine instructions of the programmable processors, and these computing programs may be implemented by high-level process and/or object-oriented programming languages, and/or assembly/machine languages. As used herein, the terms "machine-readable medium" and "computer-readable medium" refer to any computer program product, device, and/or apparatus (e.g., magnetic disks, optical disks, storages, programmable logic devices (PLD)) used to provide machine instructions and/or data to a programmable processor, including a machine-readable media that receive machine instructions as machine-readable signals. The term "machine-readable signal" refers to any signal used to provide machine instructions and/or data to a programmable processor.

In order to provide interaction with a user, systems and technologies described herein may be implemented on a computer, the computer has a display device (e.g., cathode ray tube (CRT) or liquid crystal display (LCD) monitor)

used to display information to the user; and a keyboard and a pointing device (e.g., a mouse or a trackball), the user may provide input to the computer through the keyboard and the pointing device. Other kinds of devices may also be used to provide interaction with the user; for example, feedback provided to the user may be any form of sensory feedback (e.g., visual feedback, auditory feedback, or tactile feedback); and the input from the user may be received in any form (including acoustic input, voice input, or tactile input).

The systems and techniques described herein may be implemented in a computing system that includes back-end components (e.g., as a data server), or a computing system that includes middleware components (e.g., application servers), or a computing system that includes front-end components (e.g., a user computer with a graphical user interface or a web browser, through which the user may interact with embodiments of the systems and technologies described herein), or include such back-end components, middleware components, or a computing system that includes any combination of such back-end components, middleware components, or front-end components. Components of the system may be interconnected by any form or medium of digital data communication (e.g., a communication network). An example of the communication network includes: a local area network (LAN), a wide area network (WAN) and the Internet.

A computer system may include a client and a server. Clients and servers are generally far from each other and usually interact through a communication network. Relationship between the client and the server is generated by computer programs that run on corresponding computers and have a client-server relationship with each other.

According to the technical solutions of the embodiments of the present application, in the present application, since the first beat of the first data block is adjusted from partial writing to complete writing, write performance of the storage is improved.

It should be understood that various forms of processes shown above may be used, steps may be reordered, added, or deleted. For example, the steps described in the present application may be performed in parallel, sequentially, or in different orders. As long as desired results of the technical solutions disclosed in the present application may be achieved, no limitation is made herein.

The specific embodiments do not constitute a limitation on the protection scope of the present application. Those skilled in the art should understand that various modifications, combinations, sub-combinations and substitutions may be made according to design requirements and other factors. Any modification, equivalent replacement and improvement made within the spirit and the principle of the present application shall be included in the protection scope of the present application.

What is claimed is:

1. A data output method, comprising:
    reading a first data sub-block, and splicing the first data sub-block into a continuous data stream, wherein the first data sub-block is a data sub-block in transferred data in a neural network;
    compressing the continuous data stream to acquire a second data sub-block;
    determining, according to a length of the first data sub-block and a length of the second data sub-block, whether there is a gain in compression of the continuous data stream;
    outputting the second data sub-block if there is the gain in the compression of the continuous data stream.

2. The method according to claim 1, wherein, determining, according to the length of the first data sub-block and the length of the second data sub-block, whether there is the gain in the compression of the continuous data stream comprises:
    calculating, according to the length of the first data sub-block, a destination address and a bus bit-width of a storage, the number of beats required for transferring the first data sub-block;
    calculating, according to the length of the second data sub-block, the destination address and the bus bit-width of the storage, the number of beats required for transferring the second data sub-block;
    determining, if the number of beats required for transferring the second data sub-block is less than the number of beats required for transferring the first data sub-block, that there is the gain in the compression of the continuous data stream, otherwise, determining that there is no gain in the compression of the continuous data stream, wherein the destination address is a destination address of the first data sub-block.

3. The method according to claim 1, further comprising:
    storing a length field, wherein the length field is used to indicate a smaller value between the length of the first data sub-block and the length of the second data sub-block, and the length field is used for reading a data sub-block corresponding to the length field when reading data.

4. The method according to claim 1, further comprising:
    storing a flag bit of the second data sub-block if the second data sub-block is outputted, wherein the stored flag bit is used to indicate whether there is a compression gain in a case that the second data sub-block is compressed.

5. The method according to claim 1, wherein, the transferred data in the neural network comprises a plurality of data sub-blocks of a first type, wherein each of the plurality of data sub-blocks of the first type has a same size;
    compressing the continuous data stream to acquire the second data sub-block comprises:
    determining whether the first data sub-block is a data sub-block of the first type, and compressing the continuous data stream to acquire the second data sub-block if the first data sub-block is the data sub-block of the first type.

6. The method according to claim 5, wherein, the transferred data in the neural network further comprises a data sub-block of a second type and/or a data sub-block of a third type, wherein the data sub-block of the second type and/or the data sub-block of the third type are data sub-blocks formed by remaining data after the transferred data in the neural network is segmented into the plurality of data sub-blocks of the first type.

7. The method according to claim 1, further comprising:
    outputting the first data sub-block if there is no gain in the compression of the continuous data stream.

8. An electronic apparatus, comprising:
    at least one processor; and
    a storage connected to the at least one processor; wherein,
    the storage stores an instruction executable by the at least one processor, the instruction is performed by the at least one processor to enable the at least one processor to perform the method according to claim 1.

9. A non-transitory computer-readable storage medium storing a computer instruction, wherein, the computer instruction is used to cause a computer to perform the method according to claim 1.

10. A data acquisition method, comprising:
reading a length of a second data sub-block;
reading the second data sub-block;
determining whether the second data sub-block is a data sub-block acquired after compression and having a compression gain;
decompressing the second data sub-block if the second data sub-block is the data sub-block acquired after compression and having the compression gain, and storing data acquired after decompression.

11. The method according to claim 10, wherein, determining whether the second data sub-block is the data sub-block acquired after compression and having the compression gain comprises:
determining, according to the length of the second data sub-block, whether the second data sub-block is the data sub-block acquired after compression and having the compression gain; or
reading a flag bit of the second data sub-block, and determining, according to the flag bit, whether the second data sub-block is the data sub-block acquired after compression and having the compression gain, wherein the flag bit is used to indicate whether there is the compression gain in a case that the second data sub-block is compressed.

12. The method according to claim 11, wherein, determining, according to the length of the second data sub-block, whether the second data sub-block is the data sub-block acquired after compression and having the compression gain comprises:
calculating, according to an original length of data corresponding to the second data sub-block, a storage address and a bus bit-width of a storage, the number of beats required for transferring original data corresponding to the second data sub-block;
calculating, according to the length of the second data sub-block, the storage address and the bus bit-width of the storage, the number of beats required for transferring the second data sub-block;
determining, if the number of beats required for transferring the second data sub-block is less than the number of beats required for transferring the original data corresponding to the second data sub-block, that the second data sub-block is the data sub-block acquired after compression and having the compression gain, otherwise, determining that the second data sub-block is not the data sub-block acquired after compression and having the compression gain, wherein the storage address is a storage address of the second data sub-block.

13. The method according to claim 10, wherein, the second data sub-block is a data sub-block in transferred data in a neural network, the transferred data in the neural network comprises a plurality of data sub-blocks of a first type, wherein each of the plurality of data sub-blocks of the first type has a same size;
determining whether the second data sub-block is the data sub-block acquired after compression and having the compression gain comprises: determining whether the second data sub-block is the data sub-block of the first type, and determining whether the second data sub-block is the data sub-block acquired after compression and having the compression gain if the second data sub-block is the data sub-block of the first type.

14. The method according to claim 13, wherein, the transferred data in the neural network further comprises a data sub-block of a second type and/or a data sub-block of a third type, wherein the data sub-block of the second type and/or the data sub-block of the third type are data sub-blocks formed by remaining data after the transferred data in the neural network is segmented into the plurality of data sub-blocks of the first type.

15. The method according to claim 10, further comprising:
storing the second data sub-block if the second data sub-block is not the data sub-block acquired after compression and having the compression gain.

16. An electronic apparatus, comprising:
at least one processor; and
a storage connected to the at least one processor; wherein, the storage stores an instruction executable by the at least one processor, the instruction is performed by the at least one processor to enable the at least one processor to perform the method according to claim 10.

17. A non-transitory computer-readable storage medium storing a computer instruction, wherein, the computer instruction is used to cause a computer to perform the method according to claim 10.

* * * * *